United States Patent
Ho

(10) Patent No.: US 11,189,501 B1
(45) Date of Patent: Nov. 30, 2021

(54) CHIP PACKAGE STRUCTURE AND MANUFACTURING METHOD THEREOF

(71) Applicant: Chung W. Ho, Taipei (TW)

(72) Inventor: Chung W. Ho, Taipei (TW)

(*) Notice: Subject to any disclaimer, the term of this patent is extended or adjusted under 35 U.S.C. 154(b) by 0 days.

(21) Appl. No.: 17/209,233

(22) Filed: Mar. 23, 2021

(51) Int. Cl.
*H01L 21/56* (2006.01)
*H01L 23/552* (2006.01)
*H01L 23/31* (2006.01)
*H01L 23/00* (2006.01)

(52) U.S. Cl.
CPC .......... *H01L 21/568* (2013.01); *H01L 21/561* (2013.01); *H01L 23/3135* (2013.01); *H01L 23/552* (2013.01); *H01L 24/05* (2013.01); *H01L 2224/05624* (2013.01); *H01L 2224/05647* (2013.01)

(58) Field of Classification Search
None
See application file for complete search history.

(56) References Cited

U.S. PATENT DOCUMENTS

| 7,939,383 | B2* | 5/2011 | Huang | H01L 23/58 438/127 |
| 2006/0079027 | A1* | 4/2006 | Yamada | H01L 23/49816 438/121 |
| 2020/0203248 | A1 | 6/2020 | Nair et al. | |
| 2020/0395272 | A1* | 12/2020 | Bang | H01L 23/481 |

FOREIGN PATENT DOCUMENTS

CN 211150553 7/2020

* cited by examiner

Primary Examiner — Jay C Chang
(74) Attorney, Agent, or Firm — JCIPRNET

(57) ABSTRACT

A manufacturing method a chip package structure. The carrier board includes a substrate and a stainless steel layer sputtered on the substrate. The substrate has multiple first cavities and at least one second cavity. The stainless steel layer conformally covers the first cavities and the second cavity to define multiple third cavities and at least one fourth cavity. Conductive blocks fill the third cavities. At least one metal layer covers the stainless steel layer, the conductive blocks, and the fourth cavity to define at least one fifth cavity. At least one chip is disposed inside the fifth cavity. At least one circuit structure layer is formed on the carrier board. A patterned circuit layer of the circuit structure layer is electrically connected with multiple electrodes of the chip. The carrier board and the circuit structure layer are separated to expose the conductive blocks and the metal layer.

15 Claims, 13 Drawing Sheets

CHIP PACKAGE STRUCTURE AND MANUFACTURING METHOD THEREOF

TECHNICAL FIELD

The invention relates to a package structure and a manufacturing method thereof, and particularly, to a chip package structure and a manufacturing method thereof.

DESCRIPTION OF RELATED ART

In the well-known coreless manufacturing process, part of the edge of the carrier board and part of the edge of the circuit board are first bonded with adhesive or copper-plated edge sealing. In another convention, a thin substrate (with a thickness of 100 μm, for example) containing a glass fiber cloth and, on each of both sides, being adhered with a piece of copper foil and a peelable ultra-thin copper foil (with a thickness of 3 μm to 5 μm, for example) attached thereon is employed as a carrier board. After the circuit board undergoes several processes, the part with adhesive or copper-plated edge sealing between the carrier board and the circuit board is cut off to obtain the circuit board for packaging process. However, in the well-known coreless manufacturing process, since some of the carrier board and some of the circuit board require to be cut off, the size of the circuit board may be reduced and the cut-off carrier board cannot be reused, resulting in increased manufacturing costs.

In order to solve the above problems, conventionally, a stainless steel board is employed as the base of the carrier. In the manufacturing process of the circuit structure, in addition to providing good stability, the stainless steel board does not require cutting during board separation, and may thus be reused, thereby effectively saving the manufacturing costs. However, since the stainless steel board is of a heavy weight, during the manufacturing process, handling and moving may often be difficult. Moreover, edges and corners thereof are relatively sharp, often causing damage to the manufacturing equipment.

In addition, for most package structures, electromagnetic interference (EMI) is a common but unfavorable interference, and the interference may be interruption, hindrance, reduction, or limitation of the overall performance of the circuit. Therefore, as the requirements for the packaging structure of high-frequency devices constantly increases, better electromagnetic interference shielding performance has become more stringent. In the conventional art, generally, after completion of the packaging, a metal coating on the outside of the molding compound is manufactured by electroplating or sputtering to serve to improve the electromagnetic interference shielding performance of the package structure, but this results in a thickened package structure and higher process costs.

SUMMARY

The invention provides a chip package structure and a manufacturing method thereof, which are safer and easier in terms of manufacturing, can effectively reduce manufacturing costs and increase product yields, and have better heat dissipation and anti-electromagnetic interference effects.

A manufacturing method of a chip package structure of the invention includes the following steps. A carrier board having a plurality of conductive blocks and at least one metal layer formed thereon is provided. The carrier board includes a substrate and a stainless steel layer sputtered on the substrate. The substrate has a plurality of first cavities and at least one second cavity. The first cavities surround the second cavity. The stainless steel layer conformally covers the first cavities and the second cavity to define a plurality of third cavities and at least one fourth cavity. The conductive blocks fill the third cavities. The metal layer covers the stainless steel layer, the conductive blocks, and the fourth cavity to define at least one fifth cavity. At least one chip is disposed in the fifth cavity. At least one circuit structure layer is formed on the carrier board. A patterned circuit layer of the circuit structure layer is electrically connected to a plurality of electrodes of the chip. The carrier board and the circuit structure layer are separated to expose the conductive blocks and the metal layer.

In an embodiment of the invention, the carrier board includes a sheet-shaped or roll-shaped core substrate, a sheet-shaped or roll-shaped stainless steel board, a flexible copper clad laminate, or a glass substrate plated with a titanium layer and a copper layer.

In an embodiment of the invention, the stainless steel layer has a central region and a peripheral region surrounding the central region. Before the at least one metal layer is formed on the carrier board, the following is also included. An insulating layer is formed to cover the peripheral region of the stainless steel layer. The insulating layer extends from an upper surface of the stainless steel layer and covers a side of the carrier board. The insulating layer exposes the central region.

In an embodiment of the invention, the manufacturing method of a chip package structure also includes the following. Before the at least one chip is disposed in the at least one fifth cavity of the carrier board, a plurality of first copper pillars are formed on the at least one metal layer corresponding to the conductive blocks. Before the at least one chip is disposed in the at least one fifth cavity of the carrier board, a plurality of second copper pillars are formed on the electrodes of the at least one chip.

In an embodiment of the invention, the step of forming the at least one circuit structure layer on the carrier board includes the following. A dielectric layer is formed on the metal layer. The dielectric layer covers the metal layer and the chip and wraps the first copper pillars and the second copper pillars. The patterned circuit layer is formed on the dielectric layer. The patterned circuit layer is electrically connected to the metal layer through the first copper pillars. The patterned circuit layer is electrically connected to the electrodes of the chip through the second copper pillars. A solder mask layer is formed on the patterned circuit layer. The solder mask layer has a plurality of openings, and the openings expose part of the patterned circuit layer.

In an embodiment of the invention, the step of forming the circuit structure layer on the carrier board includes the following. A dielectric layer is formed on the metal layer. The dielectric layer covers the metal layer and the chip. A plurality of through holes are formed in the dielectric layer. The through holes expose part of the metal layer and the electrodes of the chip. Conductive through holes are respectively formed in the through holes. The patterned circuit layer is formed on the dielectric layer. The patterned circuit layer is electrically connected to the metal layer and the electrodes through the conductive through holes. A solder mask layer is formed on the patterned circuit layer. The solder mask layer has a plurality of openings, and the openings expose part of the patterned circuit layer.

In an embodiment of the invention, the electrodes of the chip include a plurality of copper electrodes or a plurality of aluminum electrodes, and a material of the dielectric layer includes a photo-imagable dielectric material (PID) or a pre-preg (PP).

In an embodiment of the invention, after the carrier board and the circuit structure layer are separated to expose the conductive blocks and the metal layer, the following is also included. The metal layer is removed to expose at least a back surface of the chip and part of the circuit structure layer.

In an embodiment of the invention, the step of forming the at least one circuit structure layer on the carrier board includes the following. A dielectric layer is formed on the metal layer. The dielectric layer covers a first portion of the metal layer and the chip. A plurality of through holes are formed in the dielectric layer. The through holes expose part of the first portion of the metal layer and the electrodes of the chip. Conductive through holes are respectively formed in the through holes. The patterned circuit layer is formed on the dielectric layer. The patterned circuit layer is electrically connected to the metal layer and the electrodes through the conductive through holes. A molding compound is formed on the patterned circuit layer and a second portion of the metal layer.

In an embodiment of the invention, after the carrier board and the circuit structure layer are separated to expose the conductive blocks and the metal layer, the following is also included. The second portion and the first portion of the metal layer are removed to expose the dielectric layer and the molding compound. A third portion of the remaining metal layer covers a back surface of the chip, and a fourth portion of the remaining metal layer is located between the conductive blocks and the dielectric layer. A surface-treated layer is formed on a surface of the conductive blocks and the third portion of the remaining metal layer.

The manufacturing method of the chip package structure of the invention includes the following steps. A carrier board having at least one metal layer formed thereon is provided. The carrier board includes a substrate and a stainless steel layer sputtered on the substrate. The substrate has at least one first cavity, and the stainless steel layer conformally covers the first cavity to define at least one second cavity. The metal layer covers the stainless steel layer to define at least one third cavity. At least one chip is disposed in the third cavity. At least one circuit structure layer is formed on the carrier board, and a patterned circuit layer of the circuit structure layer is electrically connected to a plurality of electrodes of the chip. The carrier board and the circuit structure layer are separated to expose the metal layer.

A chip package structure of the invention includes a chip, a circuit structure layer, a metal layer, and a plurality of conductive blocks. The circuit structure layer includes at least one dielectric layer and at least one patterned circuit layer. The patterned circuit layer is electrically connected to a plurality of electrodes of the chip. A portion of the metal layer covers a back surface of the chip. The conductive blocks are electrically connected to the patterned circuit layer through another portion of the metal layer.

In an embodiment of the invention, the chip package structure also includes a molding compound to cover the dielectric layer, the conductive blocks, and the metal layer.

In an embodiment of the invention, the at least one dielectric layer includes a first dielectric layer and a second dielectric layer. The at least one patterned circuit layer includes a first patterned circuit layer and a second patterned circuit layer. The circuit structure layer also includes a plurality of first conductive through holes, a plurality of second conductive through holes, and a molding compound. The first patterned circuit layer is electrically connected to the electrodes of the chip through the first conductive through holes. The first patterned circuit layer is electrically connected to the conductive blocks through the first conductive through holes and another portion of the metal layer. The second patterned circuit layer is electrically connected to the first patterned circuit layer through the second conductive through holes. The molding compound wraps the first dielectric layer, the second dielectric layer, and the second patterned circuit layer.

In an embodiment of the invention, the chip package structure also includes a surface-treated layer, which covers the metal layer.

Based on the foregoing, in the manufacturing method of a chip package structure of the invention, the stainless steel layer is formed on the substrate of the carrier board by sputtering to achieve the effect of separation between the manufactured product board and the carrier board with the separability property between the stainless steel layer and the electroplated copper layer (i.e., the metal layer) thereon. Moreover, the stainless steel layer formed by sputtering is of a less size and weight compared to the conventional stainless steel board. In addition, it may be safer and simpler to apply the conventional glass fiber resin substrate in operation. Besides, since cutting is not required when separating the carrier board and the circuit structure layer, the carrier board may be reused, thereby effectively saving the manufacturing costs. Furthermore, the metal layer exposed after separating the carrier board and the circuit structure layer may directly serve as a shielding layer against electromagnetic interference. Compared to the conventional packaging after completion of which a metal coating requires to be manufactured outside the molding compound by electroplating or sputtering, the chip package structure of the invention is of a less package thickness and manufacturing process costs thereof can be reduced.

To make the aforementioned features and advantages of the invention more comprehensible, embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1A:
FIG. 1A to FIG. 1J are schematic cross-sectional views of a manufacturing method of a chip package structure of an embodiment of the invention.

Reference will now be made in detail to the exemplary embodiments of the invention, examples of which are illustrated in the accompanying drawings. Wherever possible, the same reference numerals are used in the drawings and description to represent the same or similar parts.

FIG. 1A to FIG. 1J are schematic cross-sectional views of a manufacturing method of a chip package structure of an embodiment of the invention. Regarding the manufacturing method of the chip package structure of this embodiment, first, with reference to FIG. 1F, a carrier board 100 having a plurality of conductive blocks 210 and at least one metal layer 220 formed thereon (two metal layers 220 being schematically shown) is provided. Specifically, with reference to FIG. 1A, a substrate 110 is provided, and the substrate 110 includes a core layer 112, a first conductive layer 114, and a second conductive layer 116. The first conductive layer 114 and the second conductive layer 116 are respectively disposed on two opposite surfaces of the core layer 112. A material of the core layer 112 is, for example, a glass fiber resin substrate, and a material of the first conductive layer 114 and the second conductive layer 116 is, for example, copper foil. The substrate 110 may then be regarded as a core substrate, for example. In another embodiment, the material of the core layer 112 may also be a polyimide (PI) substrate, and the substrate 110 may then be regarded as a flexible copper clad laminate (FCCL). In yet another embodiment not shown, the substrate may also be a glass substrate or a sheet-shaped or roll-shaped stainless steel board electroplated with a titanium layer and a copper layer, which still falls within the intended protection scope of the invention.

Figure 1B:
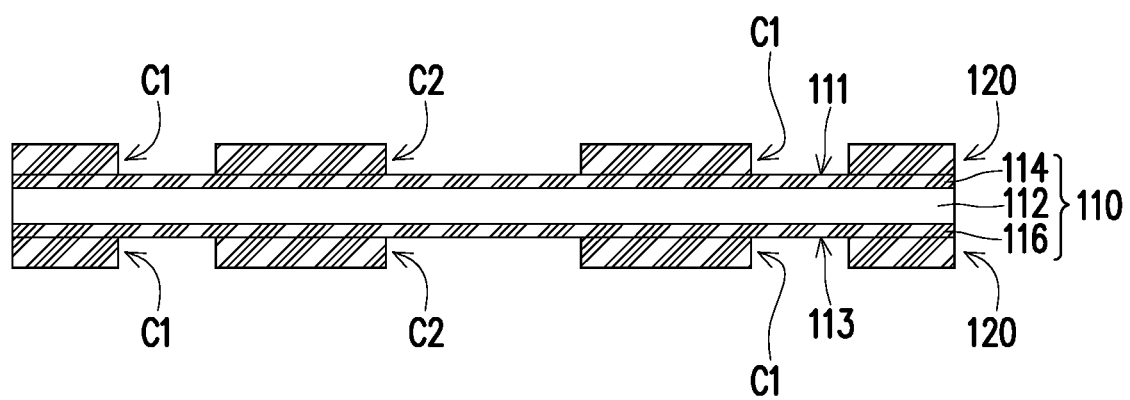

Then, with reference to FIG. 1B, a patterned conductive layer 120 is respectively formed on a first surface 111 and a second surface 113 of the substrate 110. The patterned conductive layer 120 exposes part of the first surface 111 and part of the second surface 113 of the substrate 110 to define a plurality of first cavities C1 and at least one second cavity (two second cavities C2 being schematically shown). Herein, the first cavities C1 surround the second cavity C2, a size of the first cavities C1 is less than a size of the second cavity C2, and a depth of the second cavity C2 is, for example, 70 µm to 100 µm, but they are not limited thereto.

Figure 1C:
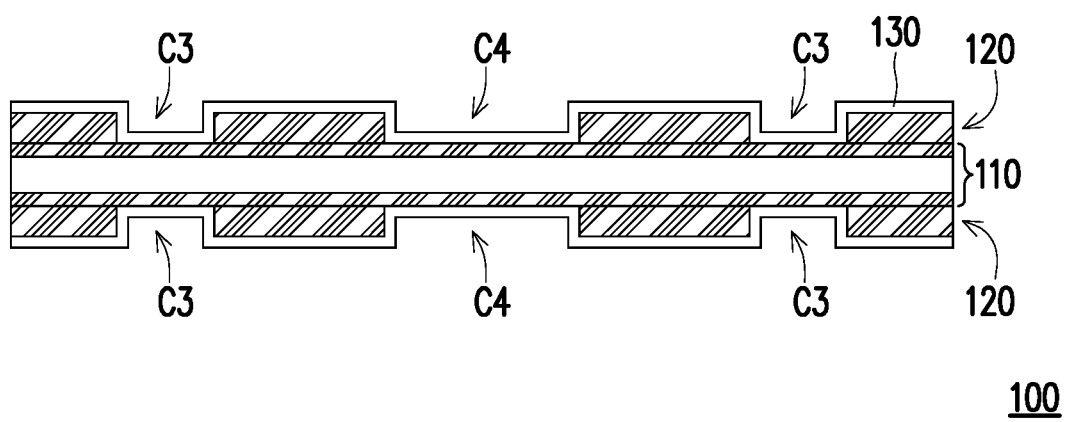

Then, with reference to FIG. 1B and FIG. 1C together, a stainless steel layer 130 is sputtered on the substrate 110, and the stainless steel layer 130 conformally covers the first cavities C1, the second cavity C2, and the patterned conductive layer 120 to define a plurality of third cavities C3 and at least one fourth cavity (two fourth cavities C4 being schematically shown). For a material of the stainless steel layer 130, for example, SUS 304, any other suitable model, or the like is used. A thickness of the stainless steel layer 130 is, for example, between 0.05 µm and 0.5 µm. In other words, the stainless steel layer 130 may be regarded as a stainless steel film. So far, the manufacturing of the carrier board 100 has been completed.

Figure 1D:
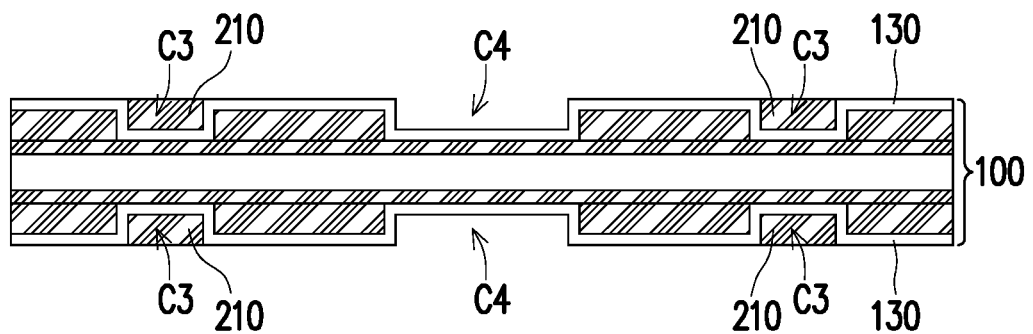

Then, with reference to FIG. 1D, the conductive blocks 210 are formed on the carrier board 100, and the conductive blocks 210 fill the third cavities C3. Herein, a surface of the conductive blocks 210 is aligned with the stainless steel layer 130.

Figure 1E:
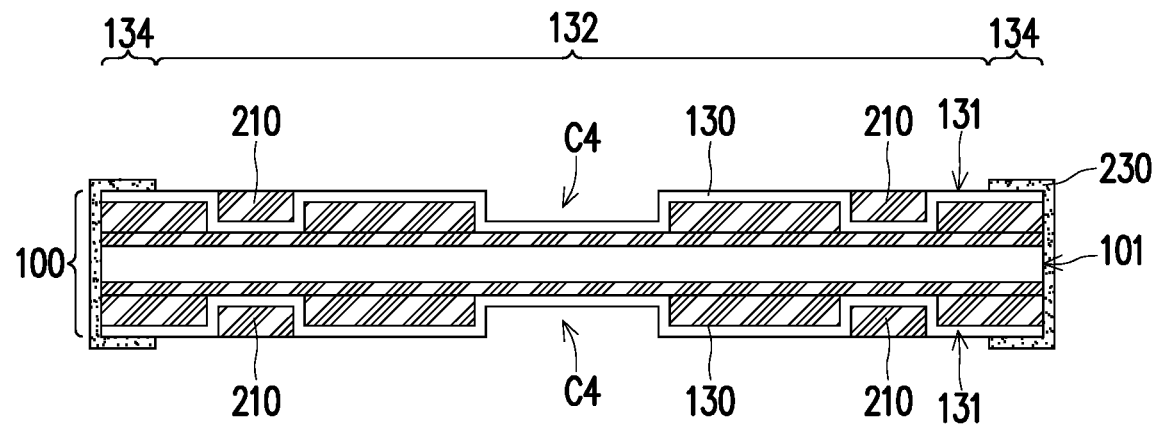

Then, with reference to FIG. 1E, an insulating layer 230 is formed on the stainless steel layer 130, the stainless steel layer 130 has a central region 132 and a peripheral region 134 surrounding the central region 132, and the insulating layer 230 covers the peripheral region 134 of the stainless steel layer 130. The insulating layer 230 extends from an upper surface 131 of the stainless steel layer 130 and covers a side 101 of the carrier board 100, and the insulating layer 230 exposes the central region 132 of the stainless steel layer 130.

Figure 1F:
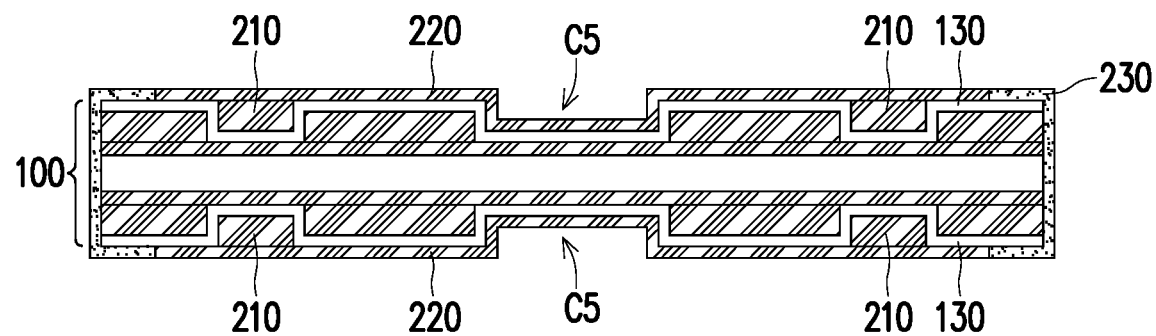

Then, with reference to FIG. 1E and FIG. 1F together, the metal layer 220 is formed to cover the stainless steel layer 130, the conductive blocks 210, and the fourth cavity C4 to define at least one fifth cavity C5 (two fifth cavities C5 being schematically shown). Herein, the metal layer 220 may be base copper, and is of a thickness of, for example, 5 µm to 10 µm, but it is not limited thereto.

Figure 1G:
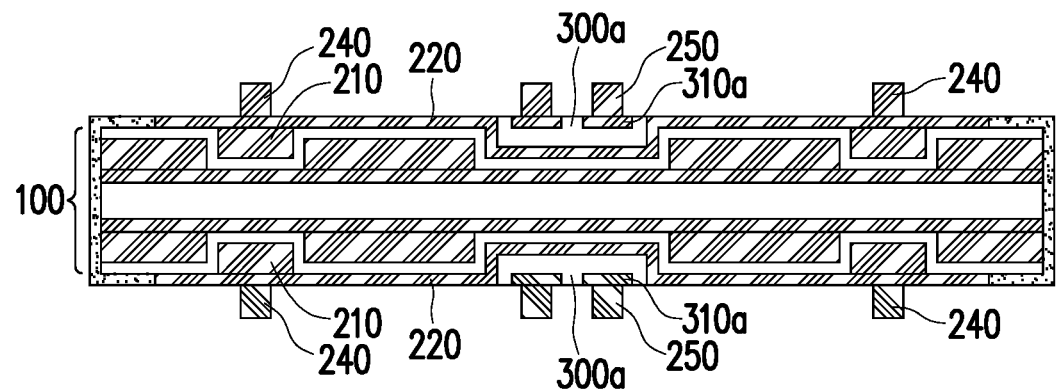

Then, with reference to FIG. 1F and FIG. 1G together, a plurality of first copper pillars 240 are formed on the metal layer 220 corresponding to the conductive blocks 210. Herein, an orthographic projection of the first copper pillars 240 on the metal layer 220 completely overlaps an orthographic projection of the conductive blocks 210 on the metal layer 220. Next, at least one chip (two chips 300a being schematically shown) is disposed in the fifth cavity C5. Herein, a plurality of electrodes 310a of the chip 300a are exposed to the outside, and the electrodes 310a are approximately aligned with the metal layer 220. In addition, a plurality of second copper pillars 250 are present on the electrodes 310a of the chip 300a.

Figure 1H:
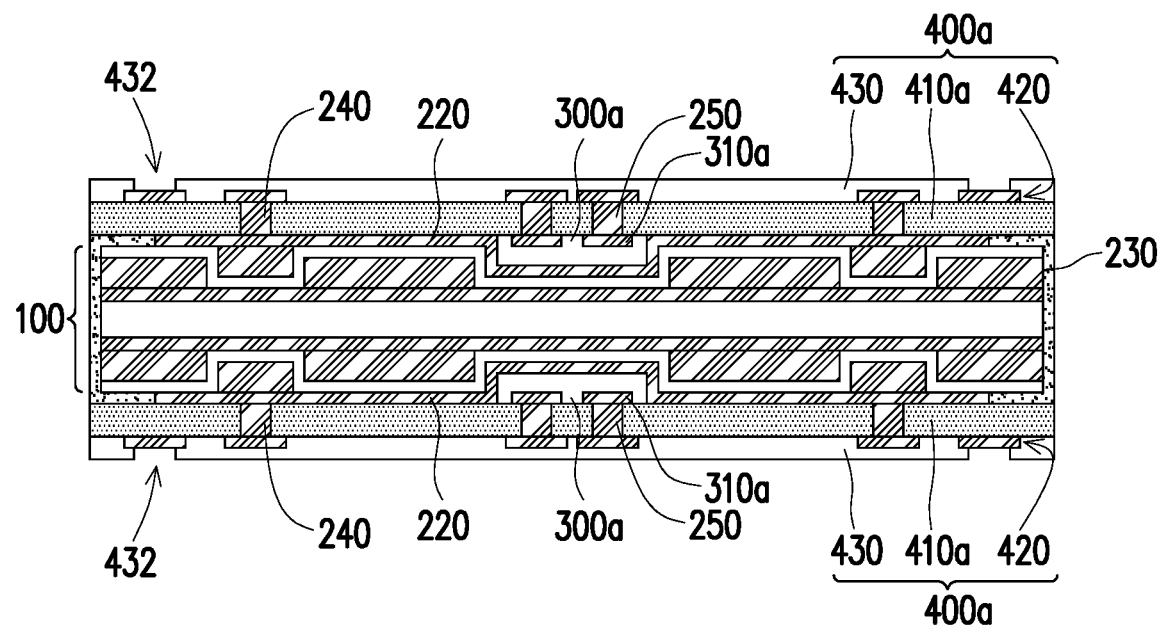

Then, with reference to FIG. 1H, at least one circuit structure layer 400a is formed on the carrier board 100. Specifically, a dielectric layer 410a is formed on the metal layer 220, and the dielectric layer 410a covers the metal layer 220, the chip 300a, and the insulating layer 230, and wraps the first copper pillars 240 and the second copper pillars 250. Herein, the dielectric layer 410a is formed, for example, through lamination, but it is not limited thereto. Next, a patterned circuit layer 420 is formed on the dielectric layer 410a. The patterned circuit layer 420 is electrically connected to the metal layer 220 through the first copper pillars 240, and the patterned circuit layer 420 is electrically connected to the electrodes 310a of the chip 300a through the second copper pillars 250. After that, a solder mask layer 430 is formed on the patterned circuit layer 420. The solder mask layer 430 has a plurality of openings 432, and the openings 432 expose part of the patterned circuit layer 420. So far, the manufacturing of the circuit structure layer 400a has been completed.

It is worth mentioning that, in some embodiments not shown, it is also possible to further form a surface-treated layer on the part of the patterned circuit layer exposed by the openings to prevent oxidation of the patterned circuit layer, providing better structural reliability and electrical performance, which still belongs to the intended protection scope of the invention.

Figure 1I:
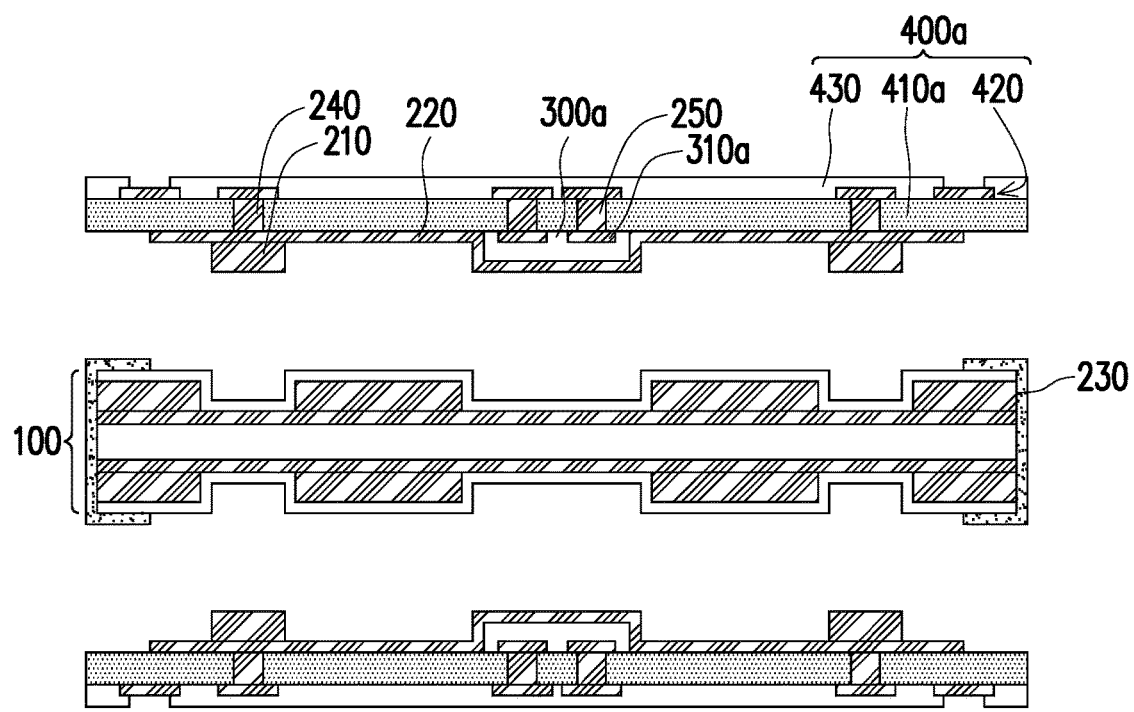

After that, with reference to FIG. 1I, the carrier board 100 and the circuit structure layer 400a are separated to expose the conductive blocks 210 and the metal layer 220.

Figure 1J:
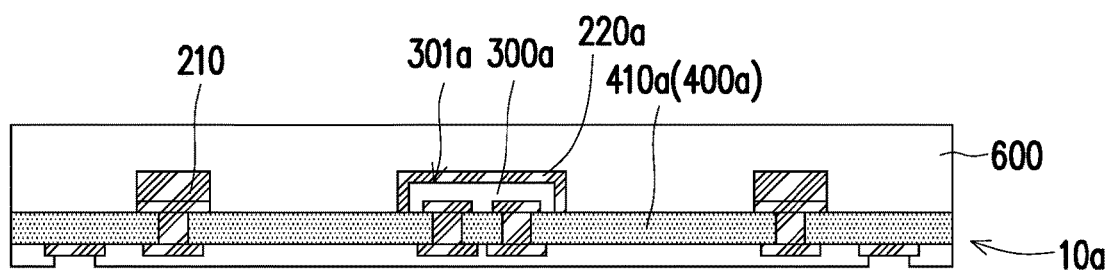

Finally, with reference to FIG. 1J, in the metal layer 220 exposed after separating the carrier board 100 and the circuit structure layer 400a, a partial metal layer 220a, namely the part corresponding to the chip 300a, may be retained, and another part of the metal layer 220 exposed outside the conductive blocks 210 may be completely removed. After that, a molding compound 600 is formed to cover the dielectric layer 410a, the conductive blocks 210, and the metal layer 220a. So far, the manufacturing of a chip package structure 10a has been completed. Since the metal layer 220a may directly serve as a shielding layer against electromagnetic interference, compared to the conventional packaging after completion of which a metal coating requires to be manufactured outside the molding compound by electroplating or sputtering, the chip package structure 10a of this embodiment is of a less package thickness and manufacturing process costs thereof can be reduced.

Briefly speaking, in the manufacturing method of the chip package structure 10a of this embodiment, the stainless steel layer 130 is formed on the substrate 110 of the carrier board 100 by sputtering to achieve the effect of separation between the manufactured product board and the carrier board 100 with the separability property between the stainless steel layer 130 and the electroplated copper layer (i.e., the metal layer) thereon. Moreover, the stainless steel layer 130 formed by sputtering is of a less size and weight compared to the conventional stainless steel board. In addition, it may be safer and simpler to apply the conventional glass fiber resin substrate in operation. Besides, since cutting is not required when separating the carrier board 100 and the circuit structure layer 400a, the carrier board 100 may be reused, thereby effectively saving the manufacturing costs.

Figure 1K:
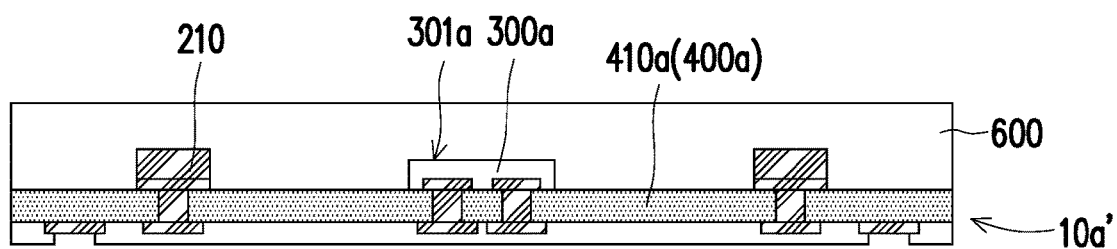
FIG. 1K is a schematic cross-sectional view of a chip package structure of an embodiment of the invention.

It is worth mentioning that, in another embodiment, after the step of FIG. 1I, namely after the carrier board 100 and the circuit structure layer 400a are separated to expose the conductive blocks 210 and the metal layer 220, with reference to FIG. 1K, it is also possible to remove the metal layer 220 exposed outside the conductive blocks 210 by etching to expose at least a back surface 301a of the chip 300a and the dielectric layer 410a of the circuit structure layer 400a. After that, the molding compound 600 is formed to cover the dielectric layer 410a, the conductive blocks 210, and the back surface 301a of the chip 300a. So far, the manufacturing of a chip package structure 10a' has been completed.

FIG. 2A to FIG. 2D are schematic cross-sectional views of a manufacturing method of a chip package structure of another embodiment of the invention. The reference numerals and part of the content of the above embodiments remain to be used in this embodiment, where the same reference numerals are adopted to represent the same or similar elements, and the description of the same technical content is omitted. Reference may be made to the above embodiments for the description of the omitted part, which will not be repeated in this embodiment.

Figure 2A:
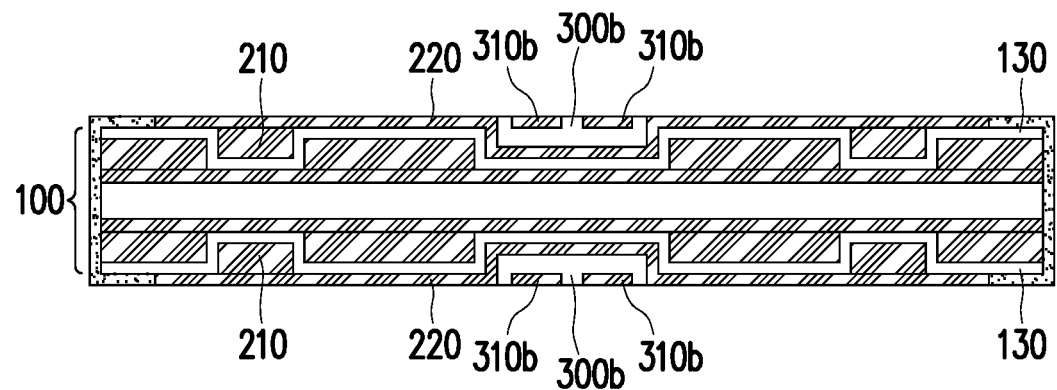
FIG. 2A to FIG. 2D are schematic cross-sectional views of a manufacturing method of a chip package structure of another embodiment of the invention.

After the step of FIG. 1F, namely after the metal layer 220 is formed to cover the stainless steel layer 130, the conductive blocks 210, and the fourth cavity C4 to define the fifth cavity C5, with reference to FIG. 1F and FIG. 2A together, at least one chip (two chips 300b being schematically shown) is disposed in the fifth cavity C5. Herein, a plurality of electrodes 310b of a chip 300b are exposed to the outside, and the electrodes 310b are approximately aligned with the metal layer 220. Herein, the electrodes 310b of the chip 300b are, for example, copper electrodes, but they are not limited thereto.

Figure 2B:
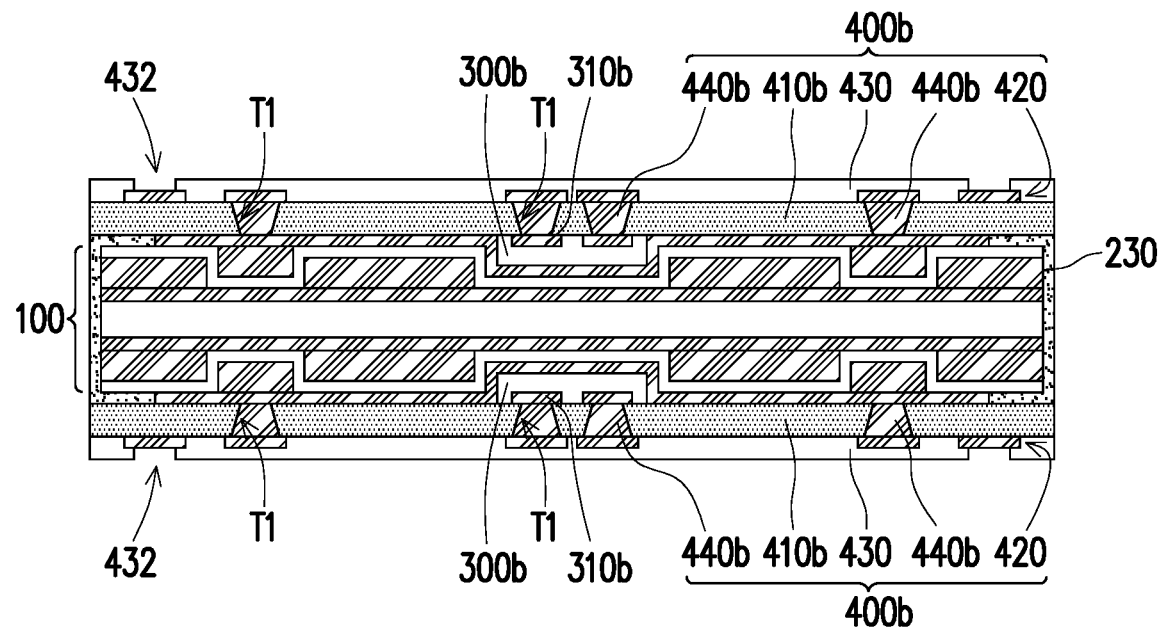

Then, with reference to FIG. 2B, a circuit structure layer 400b is formed on the carrier board 100. First, a dielectric layer 410b is formed on the metal layer 220, and the dielectric layer 410b covers the metal layer 220, the chip 300b, and the insulating layer 230. Herein, the dielectric layer 410b is formed, for example, through lamination, and a material of the dielectric layer 410b is, for example, a pre-preg (PP), but it is not limited thereto. Then, a plurality of through holes T1 are formed in the dielectric layer 410b, and the through holes T1 expose part of the metal layer 220 and the electrodes 310b of the chip 300b. Herein, the through holes T1 are formed, for example, through laser ablation, but it is not limited thereto. Next, conductive through holes 440b are respectively formed in the through holes T1, and the conductive through holes 440b fill the through holes T1 and connect the metal layer 220 and the electrodes 310b of the chip 300b. Then, the patterned circuit layer 420 is formed on the dielectric layer 410b, and the patterned circuit layer 420 is electrically connected to the metal layer 220 and the electrodes 310b through the conductive through holes 440b. The solder mask layer 430 is formed on the patterned circuit layer 420. The solder mask layer 430 has the plurality of openings 432, and the openings 432 expose part of the patterned circuit layer 420. So far, the manufacturing of the circuit structure layer 400b has been completed.

It is worth mentioning that, in some embodiments not shown, it is also possible to further form a surface-treated layer on the part of the patterned circuit layer exposed by the openings to prevent oxidation of the patterned circuit layer, providing better structural reliability and electrical performance, which still belongs to the intended protection scope of the invention.

Figure 2C:
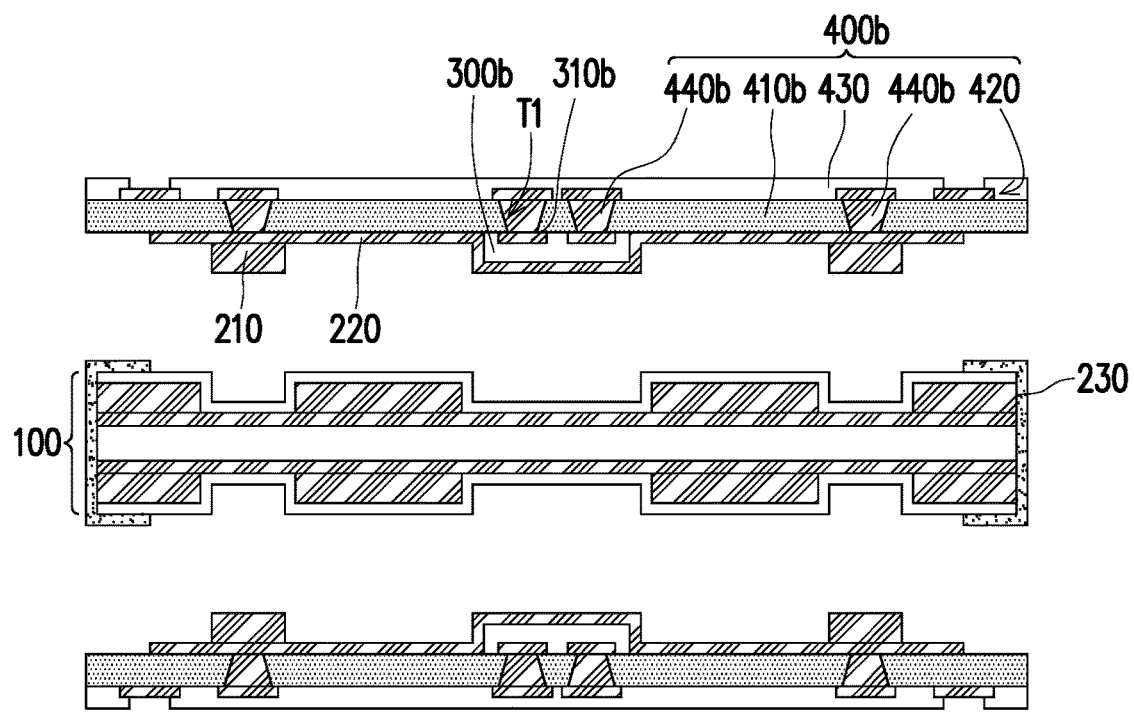

After that, with reference to FIG. 2C, the carrier board 100 and the circuit structure layer 400b are separated to expose the conductive blocks 210 and the metal layer 220.

Figure 2D:
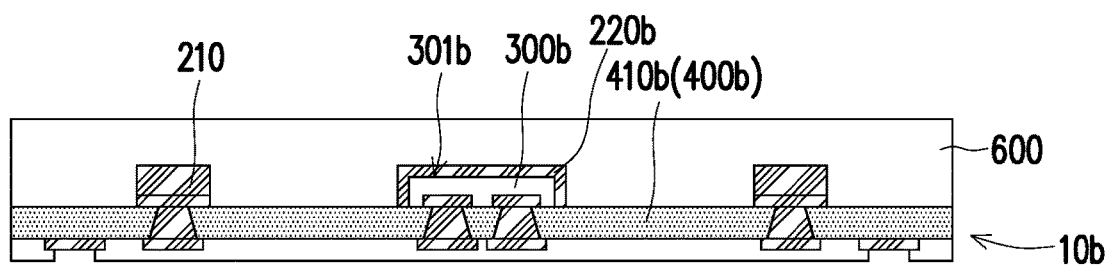

Finally, with reference to FIG. 2D, in the metal layer 220 exposed after separating the carrier board 100 and the circuit structure layer 400b, a partial metal layer 220b, namely the part corresponding to the chip 300b, may be retained, and another part of the metal layer 220 exposed outside the conductive blocks 210 may be completely removed. After that, the molding compound 600 is formed to cover the dielectric layer 410b, the conductive blocks 210, and the metal layer 220b. So far, the manufacturing of a chip package structure 10b has been completed. Since the metal layer 220b may directly serve as a shielding layer against electromagnetic interference, compared to the conventional packaging after completion of which a metal coating requires to be manufactured outside the molding compound by electroplating or sputtering, the chip package structure 10b of this embodiment is of a less package thickness and manufacturing process costs thereof can be reduced.

Figure 2E:
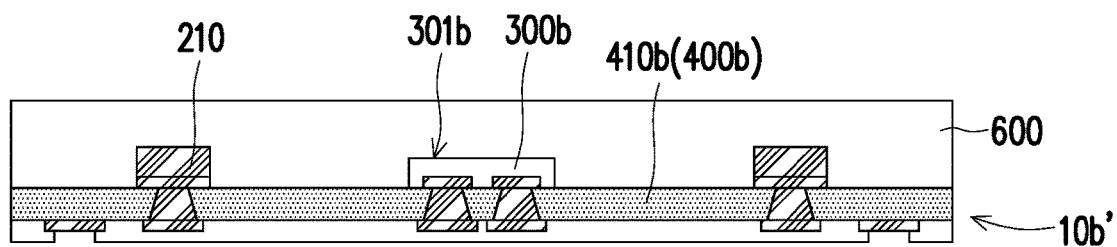
FIG. 2E is a schematic cross-sectional view of a chip package structure of another embodiment of the invention.

It is worth mentioning that, in another embodiment, after the step of FIG. 2C, namely after the carrier board 100 and the circuit structure layer 400b are separated to expose the conductive blocks 210 and the metal layer 220, with reference to FIG. 2E, it is also possible to remove the metal layer 220 exposed outside the conductive blocks 210 by etching to expose at least a back surface 301b of the chip 300b and the dielectric layer 410b of the circuit structure layer 400b. After that, the molding compound 600 is formed to cover the dielectric layer 410b, the conductive blocks 210, and the back surface 301b of the chip 300b. So far, the manufacturing of a chip package structure 10b' has been completed.

FIG. 3A to FIG. 3D are schematic cross-sectional views of a manufacturing method of a chip package structure of another embodiment of the invention. The reference numerals and part of the content of the above embodiments remain to be used in this embodiment, where the same reference numerals are adopted to represent the same or similar elements, and the description of the same technical content is omitted. Reference may be made to the above embodiments for the description of the omitted part, which will not be repeated in this embodiment.

Figure 3A:
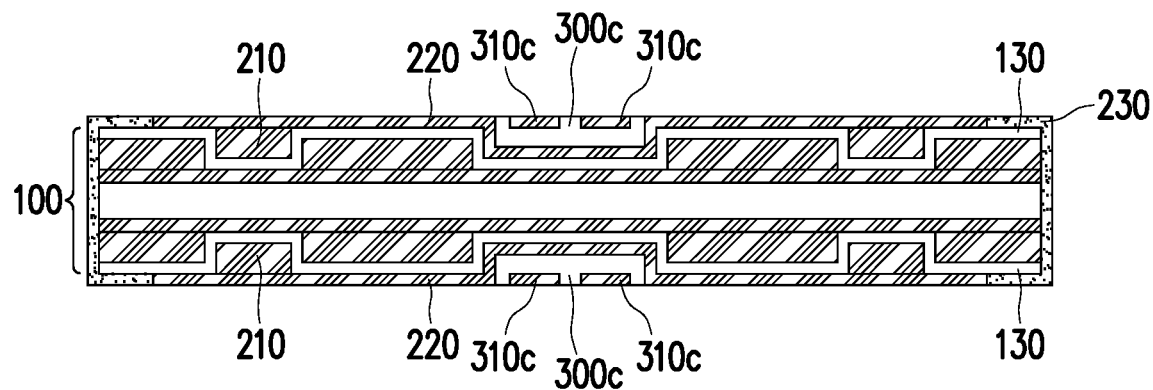
FIG. 3A to FIG. 3D are schematic cross-sectional views of a manufacturing method of a chip package structure of yet another embodiment of the invention.

After the step of FIG. 1F, namely after the metal layer 220 is formed to cover the stainless steel layer 130, the conductive blocks 210, and the fourth cavity C4 to define the fifth cavity C5, with reference to FIG. 1F and FIG. 3A together, at least one chip (two chips 300c being schematically shown) is disposed in the fifth cavity C5. Herein, a plurality of electrodes 310c of a chip 300c are exposed to the outside, and the electrodes 310c are approximately aligned with the metal layer 220. Herein, the electrodes 310c of the chip 300c are, for example, aluminum electrodes, but they are not limited thereto.

Figure 3B:
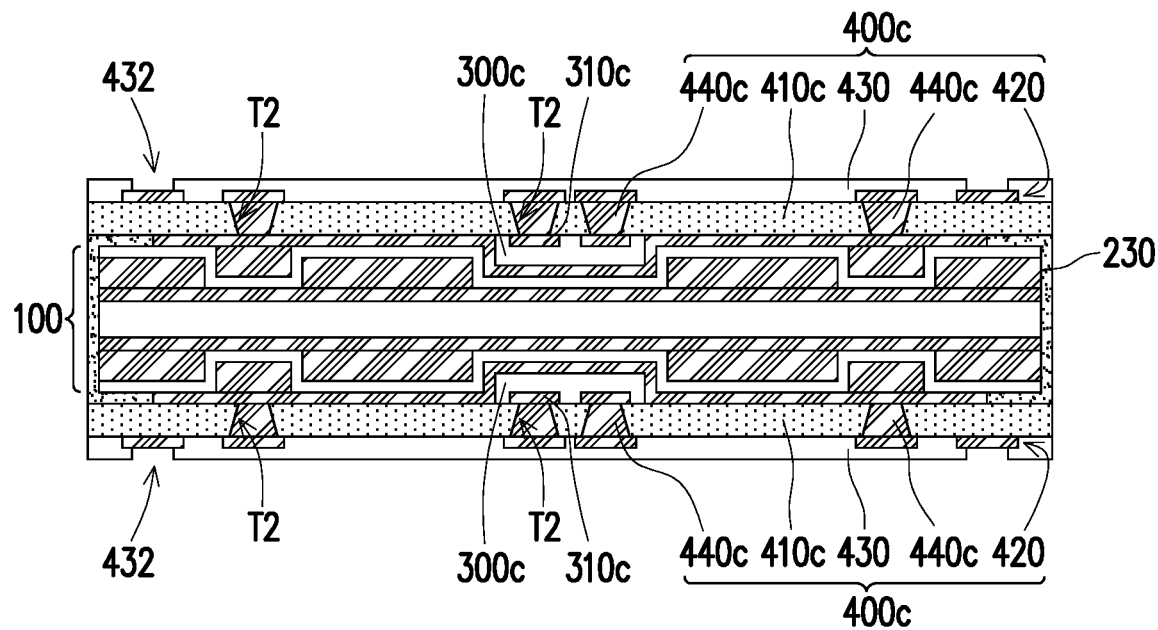

Then, with reference to FIG. 3B, a circuit structure layer 400c is formed on the carrier board 100. First, a dielectric layer 410c is formed on the metal layer 220, and the dielectric layer 410c covers the metal layer 220, the chip 300c, and the insulating layer 230. Herein, the dielectric layer 410c is formed, for example, through coating or lamination, and a material of the dielectric layer 410c is, for example, a photo-imagable dielectric (PID) material, but it is not limited thereto. Then, exposure and development is directly performed on the dielectric layer 410c to form a plurality of through holes T2 in the dielectric layer 410c, and the through holes T2 expose part of the metal layer 220 and the electrodes 310c of the chip 300c. Next, conductive through holes 440c are respectively formed in the through holes T2, by using sputtered titanium/copper as base copper for electroplating, the conductive through holes 440c are manufactured with electroplated copper, and the conductive through holes 440c fill the through holes T2 and connect the metal layer 220 and the electrodes 310c of the chip 300c. Then, the patterned circuit layer 420 is formed on the dielectric layer 410c, and the patterned circuit layer 420 is electrically connected to the metal layer 220 and the electrodes 310c through the conductive through holes 440c. The solder mask layer 430 is formed on the patterned circuit layer 420. The solder mask layer 430 has the plurality of openings 432, and the openings 432 expose part of the patterned circuit layer 420. So far, the manufacturing of the circuit structure layer 400c has been completed.

It is worth mentioning that, in some embodiments not shown, it is also possible to further form a surface-treated layer on the part of the patterned circuit layer exposed by the openings to prevent oxidation of the patterned circuit layer, providing better structural reliability and electrical performance, which still belongs to the intended protection scope of the invention.

Figure 3C:
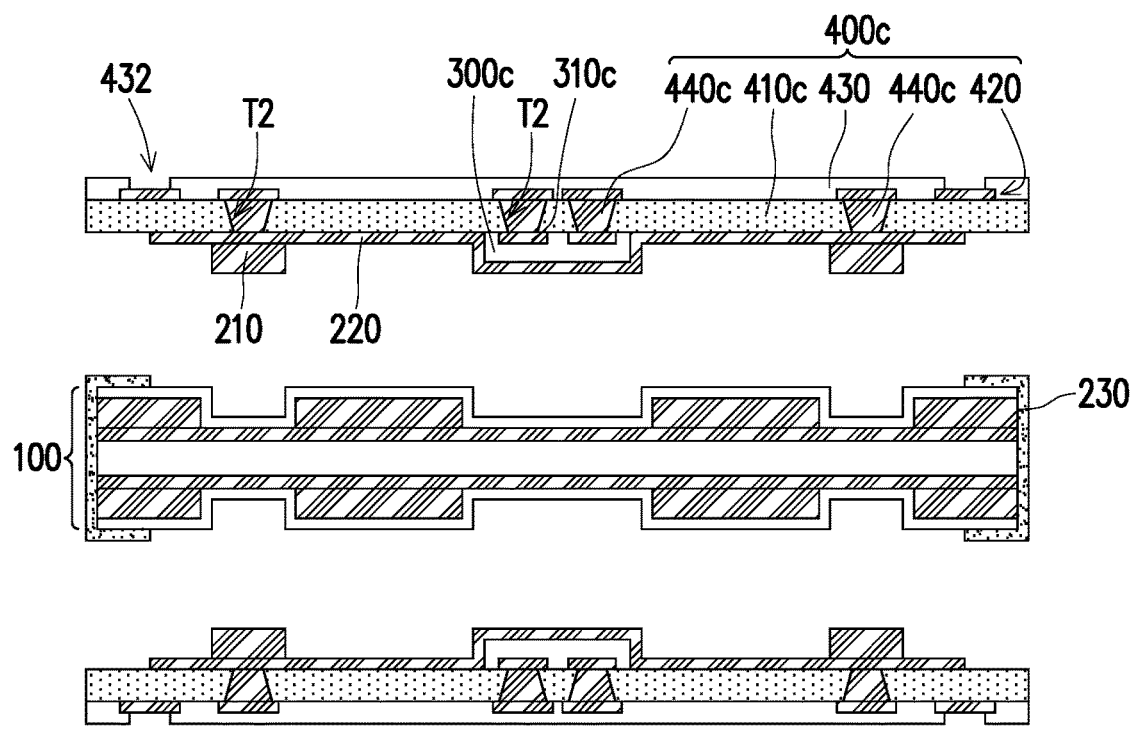

After that, with reference to FIG. 3C, the carrier board 100 and the circuit structure layer 400c are separated to expose the conductive blocks 210 and the metal layer 220.

Figure 3D:
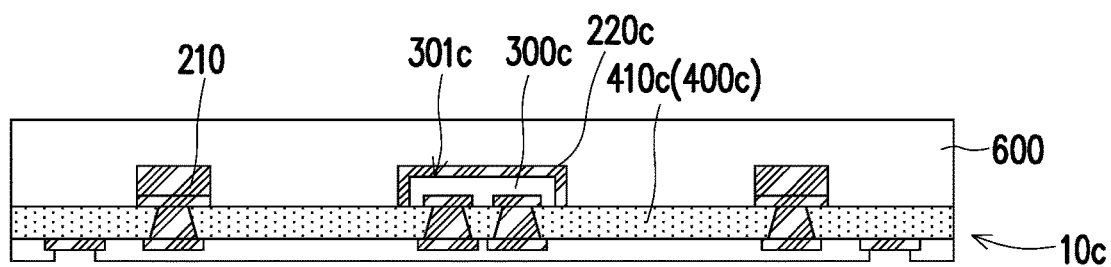

Finally, with reference to FIG. 3D, in the metal layer 220 exposed after separating the carrier board 100 and the circuit structure layer 400c, a partial metal layer 220c, namely the part corresponding to the chip 300c, may be retained, and another part of the metal layer 220 exposed outside the conductive blocks 210 may be completely removed. After that, the molding compound 600 is formed to cover the dielectric layer 410c, the conductive blocks 210, and the metal layer 220c. So far, the manufacturing of a chip package structure 10c has been completed. Since the metal layer 220c may directly serve as a shielding layer for preventing electromagnetic interference, compared to the conventional packaging after completion of which a metal coating requires to be manufactured outside the molding compound by electroplating or sputtering, the chip package structure 10c of this embodiment is of a less package thickness and manufacturing process costs thereof can be reduced.

Figure 3E:
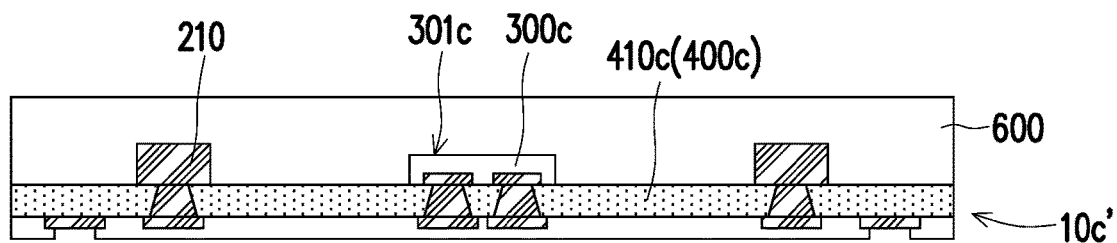
FIG. 3E is a schematic cross-sectional view of a chip package structure of another embodiment of the invention.

It is worth mentioning that, in another embodiment, after the step of FIG. 3C, namely after the carrier board 100 and the circuit structure layer 400c are separated to expose the conductive blocks 210 and the metal layer 220, with reference to FIG. 3E, it is also possible to remove the metal layer 220 exposed outside the conductive blocks 210 by etching to expose at least a back surface 301c of the chip 300c and the dielectric layer 410c of the circuit structure layer 400c. After that, the molding compound 600 is formed to cover the dielectric layer 410c, the conductive blocks 210, and the back surface 301c of the chip 300c. So far, the manufacturing of a chip package structure 10c' has been completed.

FIG. 4A to FIG. 4D are schematic cross-sectional views of a manufacturing method of a chip package structure of still another embodiment of the invention. The reference numerals and part of the content of the above embodiments remain to be used in this embodiment, where the same reference numerals are adopted to represent the same or similar elements, and the description of the same technical content is omitted. Reference may be made to the above embodiments for the description of the omitted part, which will not be repeated in this embodiment.

Figure 4A:
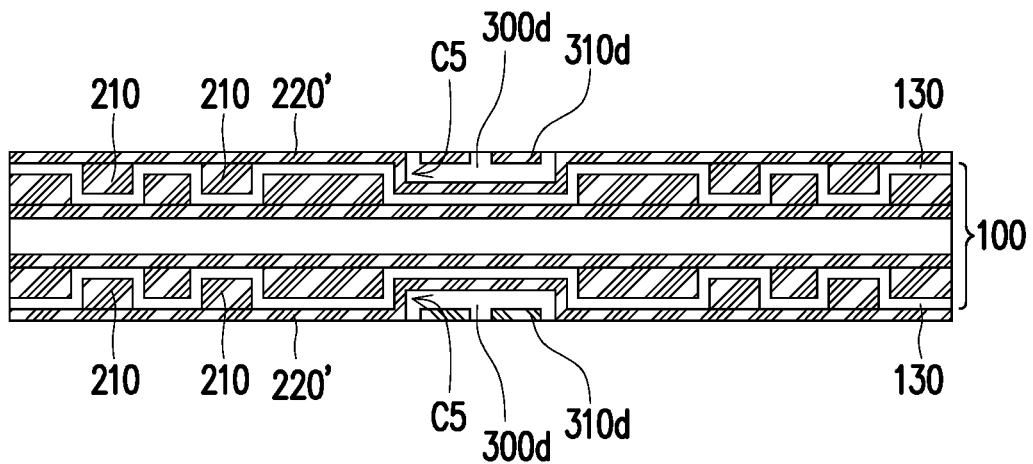
FIG. 4A to FIG. 4D are schematic cross-sectional views of a manufacturing method of a chip package structure of still another embodiment of the invention.

After the step of FIG. 1D, namely after the conductive blocks 210 are formed on the carrier board 100, with reference to FIG. 1D and FIG. 4A together, a metal layer 220' is formed to cover the stainless steel layer 130, the conductive blocks 210, and the fourth cavity C4 to define the fifth cavity C5. Next, at least one chip (two chips 300d being schematically shown) is disposed in the fifth cavity C5. Herein, a plurality of electrodes 310d of a chip 300d are exposed to the outside, and the electrodes 310d are approximately aligned with the metal layer 220.

Figure 4B:
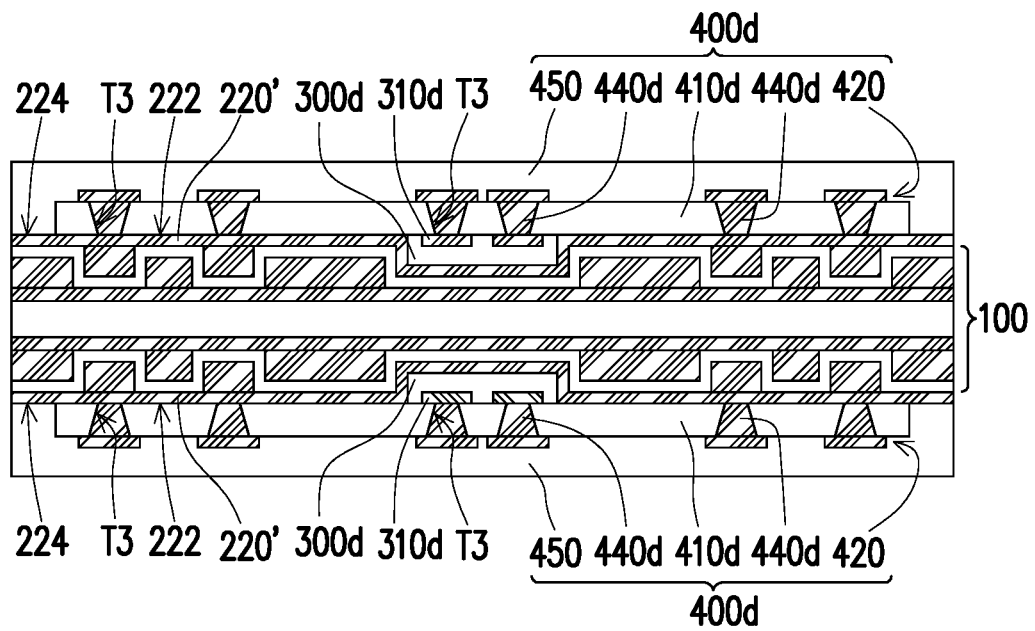

Then, with reference to FIG. 4B, a circuit structure layer 400d is formed on the carrier board 100. First, a dielectric layer 410d is formed on the metal layer 220, and the dielectric layer 410d covers a first portion 222 of the metal layer 220' and the chip 300d. Herein, the dielectric layer 410d is formed, for example, through lamination, and a material of the dielectric layer 410d is, for example, a pre-preg (PP), but it is not limited thereto. Then, a plurality of through holes T3 are formed in the dielectric layer 410d, and the through holes T3 expose part of the first portion 222 of the metal layer 220' and the electrodes 310d of the chip 300d. Then, conductive through holes 440d are respectively formed in the through holes T3, and the conductive through holes 440d fill the through holes T3 and connect the metal layer 220 and the electrodes 310d of the chip 300d. Next, the patterned circuit layer 420 is formed on the dielectric layer 410d, and the patterned circuit layer 420 is electrically connected to the metal layer 220' and the electrodes 310d through the conductive through holes 440d. After that, a molding compound 450 is formed on the patterned circuit layer 420 and a second portion 224 of the metal layer 220', and the molding compound 450 covers the dielectric layer 410d, the patterned circuit layer 420, and the second portion 224 of the metal layer 220. So far, the manufacturing of the circuit structure layer 400d has been completed.

Figure 4C:
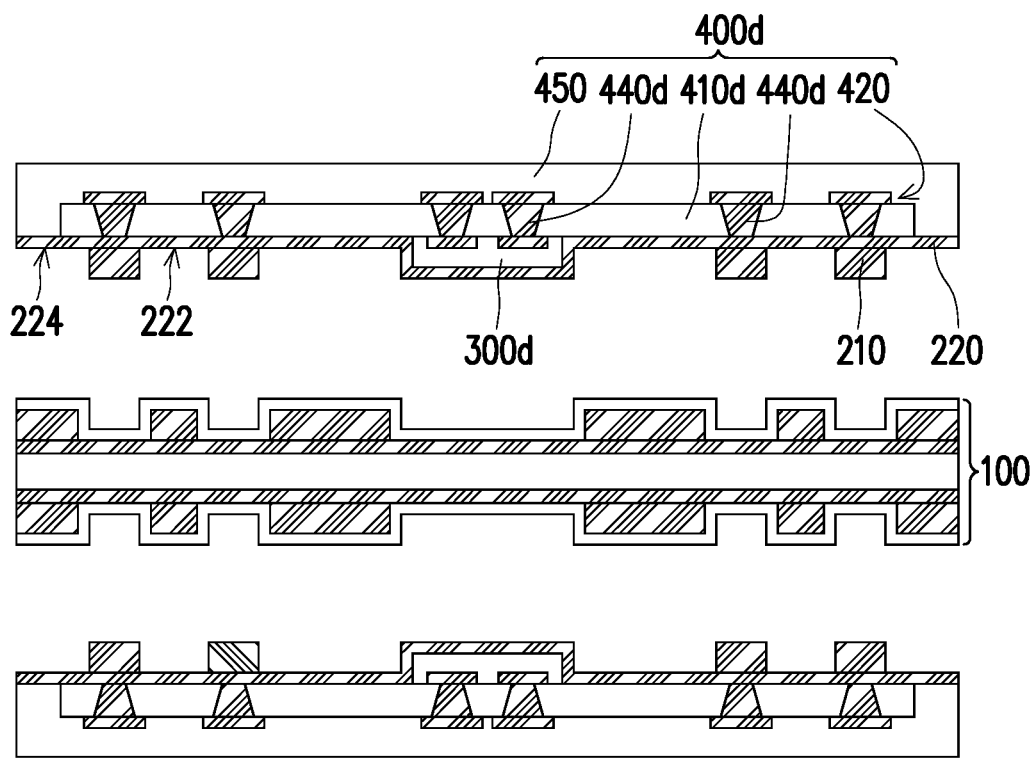

After that, with reference to FIG. 4C, the carrier board 100 and the circuit structure layer 400d are separated to expose the conductive blocks 210 and the metal layer 220. Then, with reference to 4C and FIG. 4D together, the second portion 224 and part of the first portion 222 of the metal layer 220 are removed by etching to expose the dielectric layer 410d and the molding compound 450. A third portion 226 of the remaining metal layer 220' covers a back surface 310d of the chip 330d, and a fourth portion 228 of the remaining metal layer 220' is located between the conductive blocks 210 and the dielectric layer 410d. After that, a surface-treated layer 500 is formed on the surface of the conductive blocks 210 and on the third portion 226 of the remaining metal layer 220'. A material of the surface-treated layer 500 is, for example, tin, but it is not limited thereto. So far, the manufacturing of a chip package structure 10d has been completed.

Figure 5:
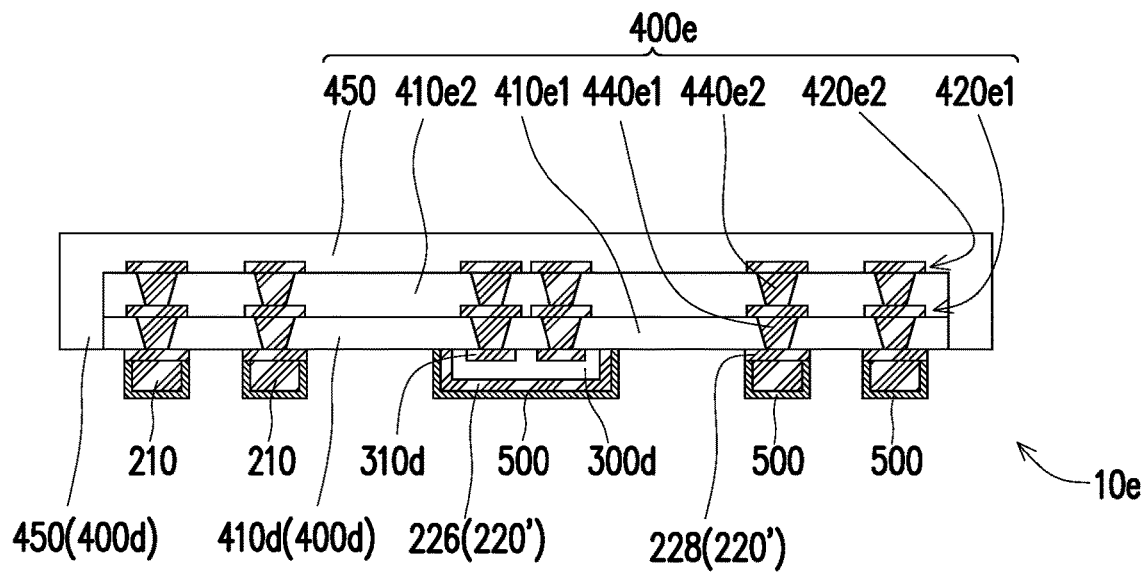
FIG. 5 is a schematic cross-sectional view of a chip package structure of an embodiment of the invention.

FIG. 5 is a schematic cross-sectional view of a chip package structure of an embodiment of the invention. The reference numerals and part of the content of the above embodiments remain to be used in this embodiment, where the same reference numerals are adopted to represent the same or similar elements, and the description of the same technical content is omitted. Reference may be made to the above embodiments for the description of the omitted part, which will not be repeated in this embodiment.

Figure 4D:
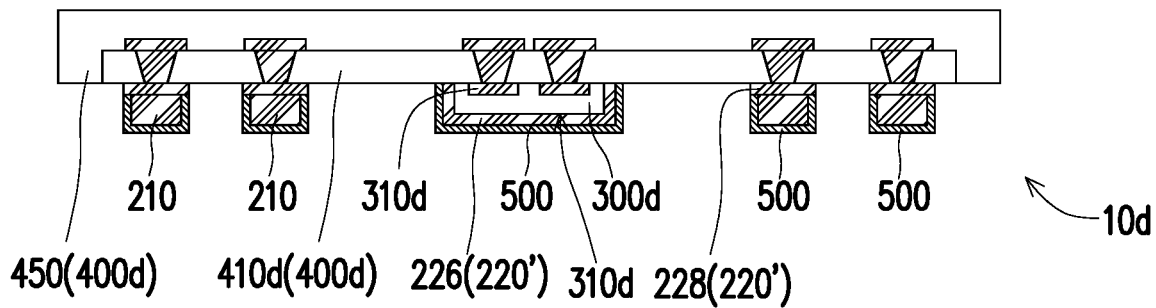

With reference to FIG. 4D and FIG. 5 together, a chip package structure 10e of this embodiment is similar to the chip package structure 10d of FIG. 4D, and the difference between the two lies in that: the circuit structure layer 400 of the chip package structure 10e of this embodiment is composed of two dielectric layers 410e1 and 410e2, two patterned circuit layers 420e1 and 420e2, a plurality of first conductive through holes 440e1, a plurality of second conductive through holes 440e2, and the molding compound 450. The patterned circuit layer 420e1 is electrically connected to the electrodes 310d of the chip 300d through the first conductive through holes 440e1, and the patterned circuit layer 420e1 is electrically connected to the conductive blocks 210 through the first conductive through holes 440e1 and the fourth portion 228 of the metal layer 220'. The patterned circuit layer 420e2 is electrically connected to the patterned circuit layer 420e1 through the second conductive through holes 440e2. The molding compound 450 wraps the dielectric layers 410e1 and 410e2 and the patterned circuit layer 420e2.

Figure 6A:
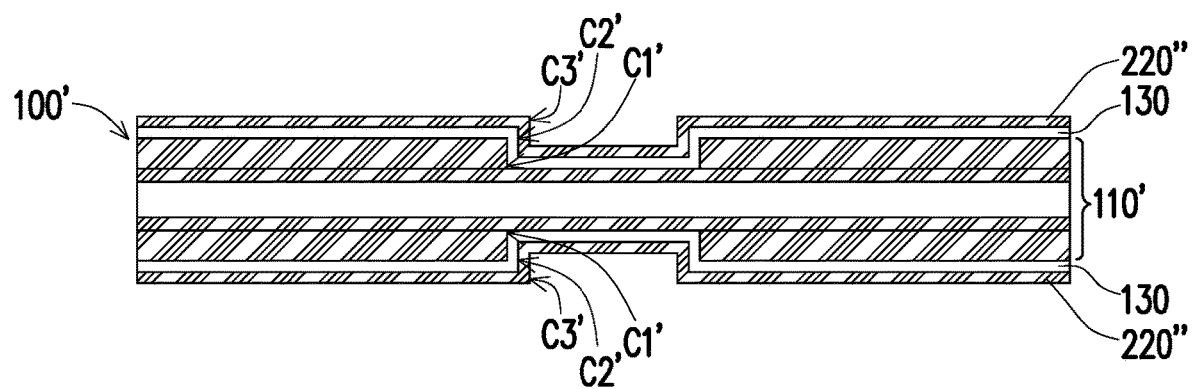
FIG. 6A to FIG. 6B are schematic cross-sectional views of part of steps of a manufacturing method of a chip package structure of another embodiment of the invention.
Figure 6B:
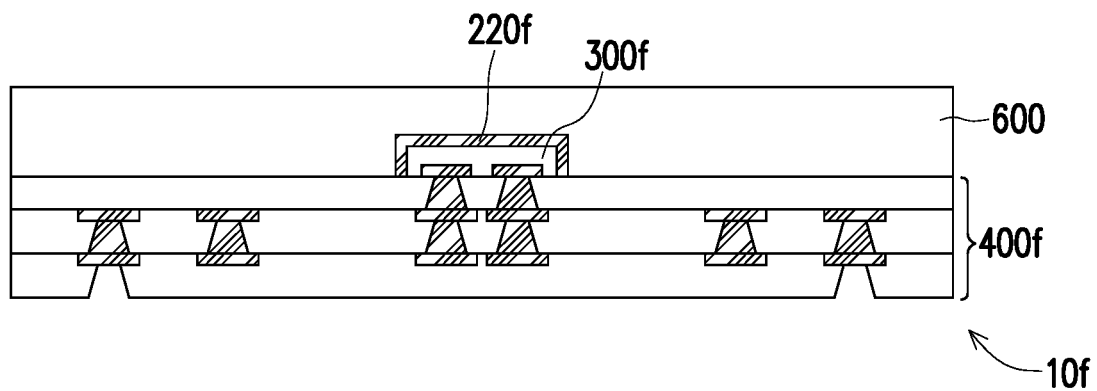

FIG. 6A to FIG. 6B are schematic cross-sectional views of part of steps of a manufacturing method of a chip package structure of another embodiment of the invention. The reference numerals and part of the content of the above embodiments remain to be used in this embodiment, where the same reference numerals are adopted to represent the same or similar elements, and the description of the same technical content is omitted. Reference may be made to the above embodiments for the description of the omitted part, which will not be repeated in this embodiment.

With reference to FIG. 6A first, a carrier board 100' having a metal layer 220" formed thereon is provided. The carrier board 100' includes a substrate 110' and the stainless steel layer 130 sputtered on the substrate 110'. The substrate 110' has at least one first cavity C1', and the stainless steel layer 130 conformally covers the first cavity C1' to define at least one second cavity C2'. The metal layer 220" covers the stainless steel layer 130 to define at least one third cavity C3'. Then, following the step after FIG. 1F, namely after a chip 300f (with reference to FIG. 6B) is disposed in the third cavity C3' (with reference to FIG. 6A), a circuit structure layer 400f (with reference to FIG. 6B) is formed on the carrier board 100' (with reference to FIG. 6A), and the carrier board 100' (with reference to FIG. 6A) and the circuit structure layer 400f (with reference to FIG. 6B) are separated to expose the metal layer 220" (with reference to FIG. 6B).

Then, in the metal layer 220" exposed after separating the carrier board 100' and the circuit structure layer 400f, with reference to FIG. 6B, a partial metal layer 220f, namely the part corresponding to the chip 300f, may be retained, and the rest of the metal layer 220" may be completely removed. After that, the molding compound 600 is formed to cover the circuit structure layer 400f and the metal layer 220f. So far, the manufacturing of a chip package structure 10f has been completed. Since the metal layer 220f may directly serve as a shielding layer against electromagnetic interference, compared to the conventional packaging after completion of which a metal coating requires to be manufactured outside the molding compound by electroplating or sputtering, the chip package structure 10f of this embodiment is of a less package thickness and manufacturing process costs thereof can be reduced.

Figure 6C:
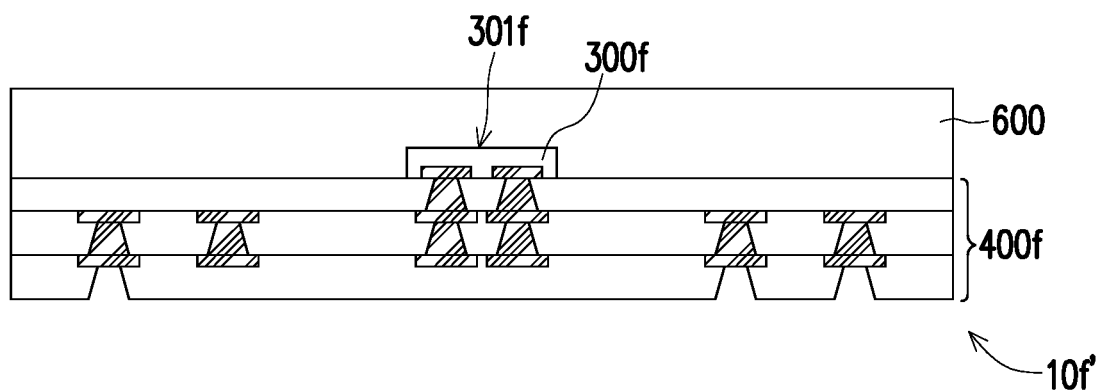
FIG. 6C is a schematic cross-sectional view of a chip package structure of another embodiment of the invention.

It is worth mentioning that, in another embodiment, after the step of FIG. 6B, namely after the carrier board 100' and the circuit structure layer 400f are separated to expose the metal layer 220", with reference to FIG. 6C, it is also possible to remove the metal layer 220" by etching to expose at least a back surface 301f of the chip 300f and the circuit structure layer 400f. After that, the molding compound 600 is formed to cover the circuit structure layer 400f and the back surface 301f of the chip 300f. So far, the manufacturing of a chip package structure 10f has been completed.

In summary of the foregoing, in the manufacturing method of a chip package structure of the invention, the stainless steel layer is formed on the substrate of the carrier board by sputtering to achieve the effect of separation between the manufactured product board and the carrier board with the separability property between the stainless steel layer and the electroplated copper layer (i.e., the metal layer) thereon. Moreover, the stainless steel layer formed by sputtering is of a less size and weight compared to the conventional stainless steel board. In addition, it may be safer and simpler to apply the conventional glass fiber resin substrate in operation. Besides, since cutting is not required when separating the carrier board and the circuit structure layer, the carrier board may be reused, thereby effectively saving the manufacturing costs. Furthermore, the metal layer exposed after separating the carrier board and the circuit structure layer may directly serve as a shielding layer against electromagnetic interference. Compared to the conventional packaging after completion of which a metal coating requires to be manufactured outside the molding compound by electroplating or sputtering, the chip package structure of the invention is of a less package thickness and manufacturing process costs thereof can be reduced.

Lastly, it should be noted that the above embodiments are merely intended for explaining, instead of limiting, the technical solutions of the invention. Although the invention is described in detail with reference to the above embodiments, those of ordinary skill in the art should understand that they can still make modifications to the technical solutions described in the above embodiments or make equivalent substitutions for some or all technical features thereof. The nature of the corresponding technical solutions with such modifications or substitutions does not depart from scope of the technical solutions of the embodiments of the invention.

What is claimed is:

1. A manufacturing method of a chip package structure, comprising:
    providing a carrier board having a plurality of conductive blocks and at least one metal layer formed thereon, the carrier board comprising a substrate and a stainless steel layer sputtered on the substrate, the substrate having a plurality of first cavities and at least one second cavity, the first cavities surrounding the at least one second cavity, the stainless steel layer conformally covering the first cavities and the at least one second cavity to define a plurality of third cavities and at least one fourth cavity, the conductive blocks filling the third cavities, and the at least one metal layer covering the stainless steel layer, the conductive blocks, and the at least one fourth cavity to define at least one fifth cavity;

disposing at least one chip in the at least one fifth cavity;

forming at least one circuit structure layer on the carrier board, wherein a patterned circuit layer of the at least one circuit structure layer is electrically connected to a plurality of electrodes of the at least one chip; and separating the carrier board and the at least one circuit structure layer to expose the conductive blocks and the at least one metal layer.

2. The manufacturing method of a chip package structure as described in claim 1, wherein the carrier board comprises a sheet-shaped or roll-shaped core substrate, a sheet-shaped or roll-shaped stainless steel board, a flexible copper clad laminate, or a glass substrate plated with a titanium layer and a copper layer.

3. The manufacturing method of a chip package structure as described in claim 1, wherein the stainless steel layer has a central region and a peripheral region surrounding the central region, and before forming the at least one metal layer on the carrier board, the method further comprises:

forming an insulating layer to cover the peripheral region of the stainless steel layer, wherein the insulating layer extends from an upper surface of the stainless steel layer and covers a side of the carrier board, and the insulating layer exposes the central region.

4. The manufacturing method of a chip package structure as described in claim 1, further comprising:

before disposing the at least one chip in the at least one fifth cavity of the carrier board, forming a plurality of first copper pillars on the at least one metal layer corresponding to the conductive blocks; and before disposing the at least one chip in the at least one fifth cavity of the carrier board, forming a plurality of second copper pillars on the electrodes of the at least one chip.

5. The manufacturing method of a chip package structure as described in claim 4, wherein the step of forming the at least one circuit structure layer on the carrier board comprises:

forming a dielectric layer on the at least one metal layer, the dielectric layer covering the at least one metal layer and the at least one chip and wrapping the first copper pillars and the second copper pillars;

forming the patterned circuit layer on the dielectric layer, the patterned circuit layer being electrically connected to the at least one metal layer through the first copper pillars, and the patterned circuit layer being electrically connected to the electrodes of the at least one chip through the second copper pillars; and forming a solder mask layer on the patterned circuit layer, the solder mask layer having a plurality of openings, and the openings exposing part of the patterned circuit layer.

6. The manufacturing method of a chip package structure as described in claim 1, wherein the step of forming the at least one circuit structure layer on the carrier board comprises:

forming a dielectric layer on the at least one metal layer, the dielectric layer covering the at least one metal layer and the at least one chip;

forming a plurality of through holes in the dielectric layer, the through holes exposing part of the at least one metal layer and the electrodes of the at least one chip;

respectively forming a plurality of conductive through holes in the through holes;

forming the patterned circuit layer on the dielectric layer, the patterned circuit layer being electrically connected to the at least one metal layer and the electrodes through the conductive through holes; and forming a solder mask layer on the patterned circuit layer, the solder mask layer having a plurality of openings, and the openings exposing part of the patterned circuit layer.

7. The manufacturing method of a chip package structure as described in claim 6, wherein the electrodes of the at least one chip comprise a plurality of copper electrodes or a plurality of aluminum electrodes, and a material of the dielectric layer comprises a photo-imagable dielectric material or a pre-preg.

8. The manufacturing method of a chip package structure as described in claim 1, wherein after separating the carrier board and the at least one circuit structure layer to expose the conductive blocks and the at least one metal layer, the method further comprises:

removing the at least one metal layer to expose at least a back surface of the at least one chip and part of the at least one circuit structure layer.

9. The manufacturing method of a chip package structure as described in claim 1, wherein the step of forming the at least one circuit structure layer on the carrier board comprises:

forming a dielectric layer on the at least one metal layer, the dielectric layer covering a first portion of the at least one metal layer and the at least one chip;

forming a plurality of through holes in the dielectric layer, the through holes exposing part of the first portion of the at least one metal layer and the electrodes of the at least one chip;

respectively forming a plurality of conductive through holes in the through holes;

forming the patterned circuit layer on the dielectric layer, the patterned circuit layer being electrically connected to the at least one metal layer and the electrodes through the conductive through holes; and forming a molding compound on the patterned circuit layer and a second portion of the at least one metal layer.

10. The manufacturing method of a chip package structure as described in claim 9, wherein after separating the carrier board and the at least one circuit structure layer to expose the conductive blocks and the at least one metal layer, the method further comprises:

removing the second portion and the first portion of the at least one metal layer to expose the dielectric layer and the molding compound, wherein a third portion of the remaining at least one metal layer covers a back surface of the at least one chip, and a fourth portion of the remaining at least one metal layer is located between the conductive blocks and the dielectric layer; and forming a surface-treated layer on a surface of the conductive blocks and the third portion of the remaining at least one metal layer.

11. A chip package structure manufactured by the manufacturing method of a chip package structure as described in claim 1, comprising:
- a chip;
- a circuit structure layer, comprising at least one dielectric layer and at least one patterned circuit layer, wherein the at least one patterned circuit layer is electrically connected to a plurality of electrodes of the chip;
- a metal layer, a portion of the metal layer covering a back surface of the chip; and
- a plurality of conductive blocks, electrically connected to the at least one patterned circuit layer through another portion of the metal layer.

12. The chip package structure as described in claim 11, further comprising a molding compound to cover the at least one dielectric layer, the conductive blocks, and the metal layer.

13. The chip package structure as described in claim 11, wherein the at least one dielectric layer comprises a first dielectric layer and a second dielectric layer, the at least one patterned circuit layer comprises a first patterned circuit layer and a second patterned circuit layer, and the circuit structure layer comprises a plurality of first conductive through holes, a plurality of second conductive through holes, and a molding compound, wherein the first patterned circuit layer is electrically connected to the electrodes of the chip through the first conductive through holes, the first patterned circuit layer is electrically connected to the conductive blocks through the first conductive through holes and the another portion of the metal layer, the second patterned circuit layer is electrically connected to the first patterned circuit layer through the second conductive through holes, and the molding compound wraps the first dielectric layer, the second dielectric layer, and the second patterned circuit layer.

14. The chip package structure as described in claim 13, further comprising a surface-treated layer, covering the metal layer.

15. A manufacturing method of a chip package structure, comprising:
- providing a carrier board having at least one metal layer formed thereon, the carrier board comprising a substrate and a stainless steel layer sputtered on the substrate, the substrate having at least one first cavity, the stainless steel layer conformally covering the at least one first cavity to define at least one second cavity, and the at least one metal layer covering the stainless steel layer to define at least one third cavity;
- disposing at least one chip in the at least one third cavity;
- forming at least one circuit structure layer on the carrier board, wherein a patterned circuit layer of the at least one circuit structure layer is electrically connected to a plurality of electrodes of the at least one chip; and
- separating the carrier board and the at least one circuit structure layer at an interface between the stainless steel layer and the metal layer covering the stainless steel layer to expose the at least one metal layer.

* * * * *